United States Patent [19]
Reader et al.

[11] 3,969,646
[45] July 13, 1976

[54] ELECTRON-BOMBARDMENT ION SOURCE INCLUDING SEGMENTED ANODE OF ELECTRICALLY CONDUCTIVE, MAGNETIC MATERIAL

[75] Inventors: Paul D. Reader; Harold R. Kaufman, both of Fort Collins, Colo.

[73] Assignee: Ion Tech, Inc., Fort Collins, Colo.

[22] Filed: Feb. 10, 1975

[21] Appl. No.: 548,763

[52] U.S. Cl. .................................. 313/359; 60/202; 313/154; 313/155; 313/362
[51] Int. Cl.² .......................... H01J 1/50; H05H 1/00
[58] Field of Search .......... 313/359, 361, 362, 154, 313/155, 156, 161; 60/202

[56] References Cited
UNITED STATES PATENTS

| | | |
|---|---|---|
| 3,238,715 | 3/1966 | Reader et al. .................. 313/362 X |
| 3,500,122 | 3/1970 | Sohl ............................... 313/362 X |
| 3,613,370 | 10/1971 | Paine ............................. 313/362 X |

*Primary Examiner*—Palmer C. Demeo
*Attorney, Agent, or Firm*—Hugh H. Drake

[57] ABSTRACT

An electron-bombardment ion source has a chamber into which an ionizable propellant is introduced. Electrons flowing from a cathode to an anode serve to ionize the propellant. The resulting ions are accelerated out of the chamber. To increase the efficiency of ionization of the propellant by the electrons, a magnetic field is established within the chamber. To that end, there are a plurality of successively-spaced segments of electrically-conductive magnetic material. The segments are interconnected so as, collectively, to serve as the anode. Individually adjacent ones of the segments are respectively polarized as magnetic opposites, the segments together serving to establish the magnetic field.

13 Claims, 5 Drawing Figures

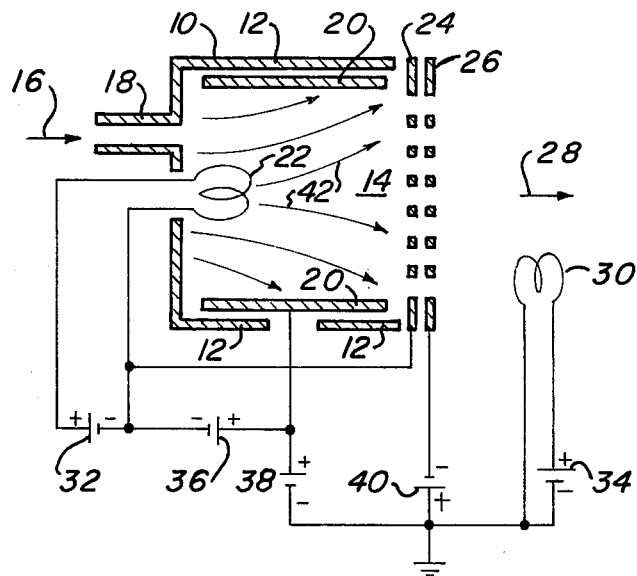
Fig_1
PRIOR ART
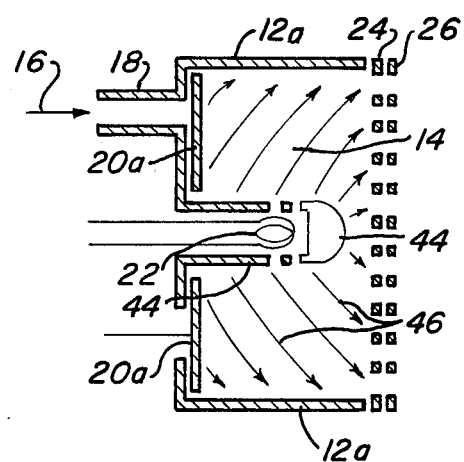
Fig_2
PRIOR ART
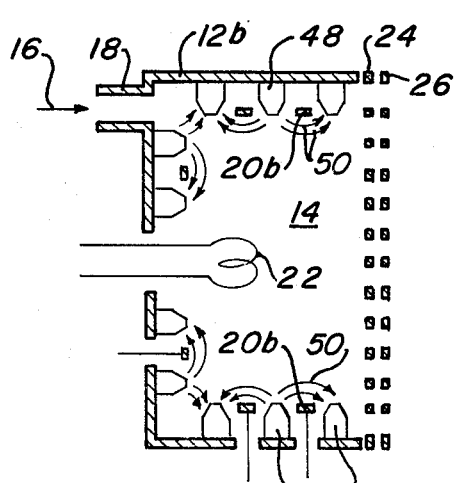
Fig_3
PRIOR ART
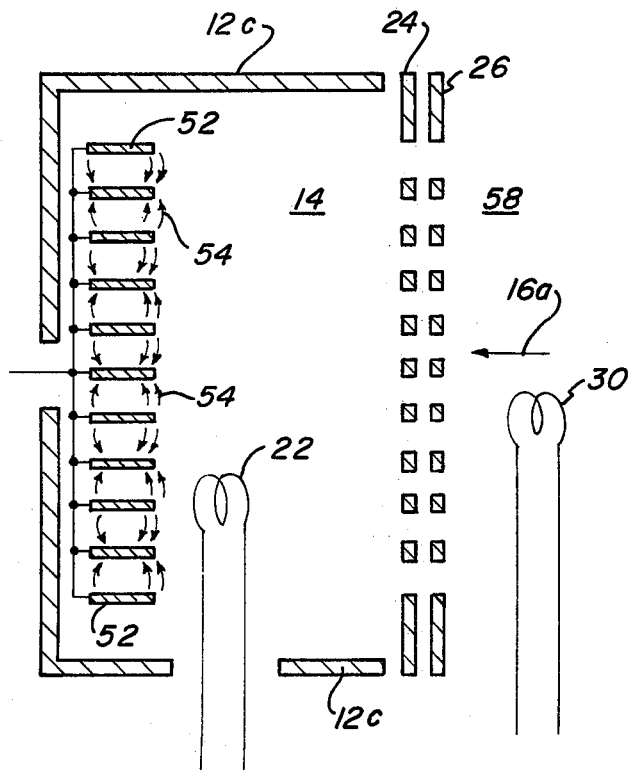
Fig_4
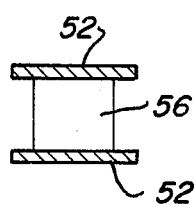
Fig_5

ELECTRON-BOMBARDMENT ION SOURCE INCLUDING SEGMENTED ANODE OF ELECTRICALLY CONDUCTIVE, MAGNETIC MATERIAL

The present invention pertains to electron-bombardment ion sources. More particularly, it relates to magnetic-field production within such ion sources.

Electron bombardment ion sources were originally developed as a means of propulsion in outer space. As compared with conventional chemical rockets, the high exhaust velocities available from such ion sources permitted a reduction in propellant mass needed to meet the same propulsion requirements. An earlier version of such an ion source, as developed specifically for space propulsion, is disclosed in U.S. Pat. No. 3,156,090. Various modifications and improvements on such an ion source are disclosed in the U.S. Pat. No. 3,238,715, 3.262,262 and 3,552,125. More recent improvements are described and claimed in copending applications Ser. No. 523,483, filed Nov. 13, 1974 Ser. No. 524,655, filed Nov. 18, 1974, all having the same title, inventors and assignee as the present application.

More recently, electron-bombardment ion sources have found use in the field of sputter machining. In that field, the ion beam produced by the source is directed against a target, so as to result in the removal of material from the target. This effect is termed sputter erosion. By protecting chosen portions of the target from the oncoming ions, material may be selectively removed from the other portions of the target. That is, these other portions of the target are thereby selectively machined.

Alternatively, essentially the same apparatus can be used for what is called sputter deposition. In this case, a surface to be coated is disposed so as to face the target in order to receive material eroded from the target. Selected portions of the surface to be treated may be masked so that the sputter material is deposited in accordance with a chosen pattern. Moreover, several different target materials may be ionically bombarded simultaneously so as to result in a controlled deposition of alloys of the different materials. In some cases, sputter deposition represents the only way in which the formation and deposit of such alloys may be achieved.

Still another use of the described ion sources is in the implantation or doping of ions into a semiconductor material. Basically, this usage differs from sputter machining only in that higher ion energies are required in order to obtain a useful distance of penetration into the semiconductor material.

Whatever the specific manner of utilization, such ion sources are especially attractive for sophisticated tasks like those of forming integrated circuit patterns. For example, conductive lines may be depositied on a substrate in thicknesses measured in Angstroms and with widths measuring but tenths or hundredths of a micron. Defects in linearity may be held to less than a few hundredths of a micron.

Electron-bombardment ion sources of the kind under discussion include a chamber into which an ionizable propellant, such as argon, is introduced. Within the chamber is an anode that attracts high-velocity electrons from a cathode. Impingement of the electrons upon the propellant atoms results in ionization of the propellant. At one end of the chamber is an apertured screen followed by an apertured grid. A potential impressed upon the grid accelerates the ions out of the chamber through the apertures in both the screen and the grid, while the apertures in the screen are alined with those in the grid so as to shield the latter from direct ionic bombardment. At least usually, another electron-emissive cathode is disposed beyond the grid for the purpose of effecting neutralization of the electric space charge otherwise exhibited by the accelerated ion beam.

In at least most prior approaches, the interior of the chamber is subjected to a magnetic field which causes the electrons emitted from the cathode to gyrate in their travel toward the anode. This greatly increases the chance of an ionizing collision between any given electron and one of the propellant atoms, thus resulting in substantially increased efficiency of ionization. Because the type of ion source under discussion operates at a comparatively low pressure, the mean-free-path for an electron that ionizes a propellant atom is typically larger than the dimensions of the ion chamber itself. Accordingly, the practice has been to shape the anode and the magnetic-field configuration such that the electrons spiral through the ion chamber before reaching the anode.

High performance in an ion chamber of the kind under discussion is related to a low discharge power loss per ampere of ions produced in the resulting ion beam. It also is related to the ionization of a high fraction of the propellant introduced into the ion chamber. The "discharge power loss" is defined as the power in the emitted electrons which effect the ionization. To the end of increasing such performance, a variety of magnetic-field configurations have been utilized. All have employed the common concept of causing the electrons to cross the magnetic field. That is, some component of the electron motion has been caused to be transverse to the direction of the magnetic field. With the introduction of the suggestion of utilizing permanent magnets for the purpose of developing the magnetic field, the concept of increasing performance by the use of high-permeability magnetic paths was implemented. To an at least somewhat analogous end, the incorporation of magnetic pole pieces has also been extended to systems that employ electro-magnets as a means of obtaining field shapes intended to result in high performance.

What is believed to be the earliest design of an ion source of the type generally under consideration utilized a cylindrical ion chamber together with a magnetic field oriented to be approximately axial of the chamber. The system for accelerating the produced ions was disposed at one end of the cylinder, and the anode was the curved outer wall of the cylinder. The cathode was disposed so that the electrons were emitted near the central axis, as a result of which they reached the anode only after various collision processing. Early experimentation with such a chamber design revealed that a divergent magnetic field, which decreased in strength toward the accelerator system, gave higher performance. Such divergent-field designs still required or involved the existence of collision processes before the electrons reached the anode, the latter still being at least effectively the outer curved wall of the cylindrical ion chamber.

In seeking greater divergence of the field, a more or less limiting case was reached in the so-called radial-field ion chamber. In that configuration, a centrally-located pole piece was employed in order to produce a field that extended approximately in the direction radially of the chamber. Electrons were emitted near the center of the chamber and were enabled to follow field lines so as to cover the entire ion-chamber cross-section with at least minimized excess collisions near the center of the ion chamber. That is, the desired collisions were better distributed throughout the cross-section of the chamber. In the radial-field design of the ion chamber, the anode was located at the end of the ion chamber opposite the accelerator system. As a result, the electrons could not ultimately reach the anode without encoutering collision processes that permitted them to cross the magnetic field. The comparative ease with which the electrons could reach the entire cross-sectional area of the ion chamber without unwanted excess collisions near the center resulted in the development of a much more uniform ion-beam profile than had previously been obtained with divergent-field design.

A recent approach has been that of using a multipole configuration. A plurality of magnetic pole pieces are distributed around the chamber and interspersed with a similar plurality of small anode sections. The magnetic field, which is thereby constituted near the walls of the ion chamber, prevents electron travel directly to the anodes. Electrons emitted from the cathode are thus able to travel comparatively freely throughout most of the ion-chamber volume, being substantially constrained by the magnetic field only as they approach the walls of the chamber. Accordingly, most of the ion chamber volume is accessible to the electrons without unwanted excess collisions at any point. As a result, the ion-beam profile is comparatively uniform. An advantage of such multipole design over the previously-mentioned radial-field design is the accessibility of the electrons to most of the ion-chamber volume without the unwanted excess collisions. In the radial-field approach, the emitted electrons do reach most of the ion-chamber cross-sectional area without unwanted excess collisions, but that occurs only because the electrons follow the field lines that extend approximately in the radial direction; consequently, the electron travel is restricted in extent. In contrast, the multipole design makes superior use of the entire volume of the ion chamber, and that, in turn, results in high chamber utilization and a more uniform ion-beam profile even in the multi-polar design. However, the magnetic field still is shaped so that electrons must cross the magnetic field in order to reach the anode or anode sections.

In most ion souces of the kind under consideration, the propellant is introduced through a manifold located at the end of the ion chamber remote from the accelerator system. Usually, some sort of baffle arrangement is emloyed in order to distribute the propelant across the extent of the ion chamber. Such a baffle arrangement is described in the aforementioned Pat. No. 3,156,090. Subsequent to the development of that approach, advantages were found to exist in the technique of introducing the propellant near to the accelerator-system-end of the ion chamber; this is the subject, for example, of the aforementioned Pat. No. 3,262,262. While introduction of the propellant into the accelerator region encountered difficulties in the overall mechanical design of the ion source, that technique was definitely shown to afford equal or higher performance than in the case when the propellant was introduced at the opposite end of the ion chamber.

Augmenting the aforedescribed continued development of electron-bombardment ion sources, it is a general object of the present invention to provide a new and improved ion source.

Another object of the present invention is to provide a new and improved ion source in which the emitted electrons are enabled to proceed throughout at least most of the ion-chamber volume without unwanted excess collisions.

A further object of the present invention is to provide a new and improved ion source which permits the chamber to be elongated in at least one dimension so as to accommodate continuous processing of materials under treatment.

A specific object of the present invention is to provide an ion source of the foregoing character which is more simple and economical of fabrication.

A still further specific object of the present invention is to provide a new and improved ion source which enables improved operation with introduction of the propellant into the ion chamber from the region of the accelerator system.

In achieving all of the foregoing objectives, it is also an aim to provide a new and improved ion chamber which produces an extremely uniform ion beam.

As constructed in accordance with the present invention, an electron-bombardment ion source thus includes a chamber into which a propellant is introduced. Disposed within the chamber are an anode and an electron-emissive cathode. A potential difference is impressed between the anode and the cathode in order to effect electron emission at a sufficient velocity to ionize the propellant. Means are included for accelerating ions out of the chamber. Also included are means for establishing a magnetic field within the chamber in order to increase the efficiency of ionization of the propellant by the electrons. As an improvement upon such a basic ion source, it includes a plurality of successively-spaced segments of electrically-conductive magnetic material distributed within the chamber. Such segments are interconnected with the potential impressing means so that the segments collectively constitute the anode. finally, individually adjacent ones of the segments are respectively polarized oppositely in a magnetic sense so that the segments collectively establish the magnetic field.

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

FIG. 1 is a schematic diagram of what is known as a divergent-field electron-bombardment ion source and its associated circuitry;

FIG. 2 is a fragmentary schematic diagram of what is known as a radial-field electron-bombardment ion source;

FIG. 3 is a fragmentary schematic diagram of what may be termed a multipole electron-bombardment ion source;

FIG. 4 is a fragmentary schematic diagram of an electron-bombardment ion source constructed in accordance with one embodiment of the present invention; and FIG. 5 is a schematic diagram of a fragmentary enlarged portion of the apparatus shown in FIG. 4.

In order perhaps to gain a better understanding of the subject matter, a rather full explanation will first be given with respect to the nature and operation of a typical known electron-bombardment ion source of the divergent-field type and is illustrated in FIG. 1. It will initially be observed that FIG. 1, like FIGS. 2, 3 and 4, is set forth generally in schematic form. The actual physical structure of the apparatus may, of course, vary, but a suitable and workable example of physical implementation, subject to the changes to be described further herein, is that disclosed in the aforesaid U.S. Pat. No. 3,156,090, which patent, therefore, is expressly incorporated herein by reference. Thus, housing 10 is in the form of a cylindrical metallic shell 12 that circumscribes and defines a chamber 14 in which an ionizable propellant, such as argon, is to be contained. As indicated by the arrow 16, the propellant is introduced into one end of shell 12 through a manifold 18. Disposed symmetrically within shell 12 is a cylindrical anode 20. Centrally positioned within anode 20 is a cathode 22.

In the vicinity of the end of shell 12, opposite that in which, in this case, manifold 18 is located, is an apertured screen 24. Spaced beyond screen 24 is an apertured grid 26. The apertures in screen 24 are aligned with the apertures in grid 26 so that the solid portions of grid 26 are shielded from bombardment of ions that are withdrawn from chamber 14 through screen 24 and grid 26 so as to proceed along a beam path indicated by arrow 28. Situated beyond grid 26 from chamber 14 is a neutralization cathode 30.

As herein incorporated, cathodes 22 and 30 are each formed of a refractory metal filament such as tungsten wire. The opposite ends of the cathodes are indiviudally connected across respective energizing sources 32 and 34. Sources 32 and 34 may deliver either direct or alternating current. Other types of cathodes, such as a hollow cathode which, during normal operation, requires no heating current, may be substituted. For creating and sustaining electron emission from cathode 22, a direct-current source 36 is connected with its negative terminal to cathode 22 and its positive terminal to anode 20. Connected with its positive terminal to anode 20 and its negative terminal returned to system ground, as indicated, is a main power source 38 of direct current. Another direct-current source 40 has its negative terminal connected to accelerator grid 26 and its positive terminal returned to system ground. Finally, one side of neutralizing cathode 30 also is returned to ground. Completing the energizing arrangements, screen 24 is in this case connected to one side of cathode 22.

In operation, the gaseous propellant introduced through manifold 18 is ionized by high-velocity electrons flowing from cathode 22 toward anode 20. Ions in the plasma which are thus produced are attracted by accelerator grid 26 so as to be directed along path 28. Screen 24 serves to focus the withdrawn ions so that they escape through grid 26 without impinging upon its solid portions. The resulting ion beam traveling along path 28 is then neutralized in electric space charge by means of electrons emitted from neutralizing cathode 30. Power source 36 serves to maintain the discharge current between cathode 22 and anode 20. The energy in the ions which constitute the ion beam is maintained by power source 38. Power source 40 supplies the negative potential on grid 26 necessary to accelerate the ions out of chamber 14.

Of course, the various potentials involved will vary depending upon the particular propellant utilized and the specific configuration and size of the ion source. For a typical ion source of ten centimeters in diameter utilizing argon as a propellant, the discharge potential difference from source 36 is forty to fifty volts. The net accelerating potential difference developed by source 38 is five-hundred to one-thousand volts, while the accelerating potential difference developed by source 40 is one-hundred to five-hundred volts. The ion chamber pressure is of the order of $10^{-4}$ to $10^{-3}$ Torr. The cathode heating voltages developed by sources 32 and 34 are between five and fifteen volts. At least usually, the current through accelerating source 40 is only a small fraction of the ion beam current, often of the order of 0.01 or less. Consequently, the ion beam current is substantially equal to the current delivered from main power source 38. The discharge power involved, taken from source 36, generally ranges from about two-thousand to one-thousand watts per ampere of ions formed in the ultimate ion beam.

As already cross-referenced, other and somewhat simplified energization arrangements have now been disclosed and may be included. In addition, improved circuitry for initiating the production of ions within the ion source may desirably be incorporated. Also, certain aspects of ion beam uniformity may be improved in accordance with recent teachings. Since these and other ramifications may be incorporated not only into the system of FIG. 1 as disclosed herein but also in whole or in part in any of the systems of FIGS. 2, 3 and 4 yet to be discussed, reference is again made to the aforementioned copending applications which, for that purpose, are incorporated herein by such reference.

As mentioned in the introduction, a magnetic field preferably is established within chamber 14 as by inclusion of a suitable electromagnet or permanent magnet structure surrounding shell 12. In general, the direction of the magnetic lines of force is such as to cause electrons emitted from cathode 22 to gyrate or convolute in their passage toward anode 20. Absent the presence of the magnetic field, the already-indicated pressure within chamber 14 is sufficiently low that the emitted electrons would tend to proceed to anode 20 with a rather low probability of creating ionization of the propellant. However, the presence of the magnetic field causes the electrons to increase their path lengths sufficiently so as very substantially to increase the probability of collision between the electrons and the atoms in the propellant. In FIG. 1, the magnetic field lines are indicated by arrows 42. Thus, it will be observed that the magnetic field diverges in the direction toward screen 24. Consistent with the other exemplary operating values mentioned, the maximum strength in the magnetic field is typically between ten and fifty Gauss. In the arrangement of FIG. 1, electron collisions with the neutrals, ions and other electrons in chamber 14 are required for the electrons to diffuse across magnetic field lines 42 and thus increase the probability of ion production by any given emitted electrons.

In FIG. 2, anode 20a is in the form of an annulus parallel and spaced closely adjacent to the rear wall of a shell 12a, "rear" referring to the side of the chamber opposite screen 24 and grid 26. Cathode 22 is again disposed centrally within chamber 14 but in this case it is partially enclosed within a cylindrical tube 44 of a material which exhibits a comparatively high magnetic permeability. As a result of the inclusion of tube 44, the magnetic field lines 46 extend generally in the radial direction of chamber 14. As compared with the divergent-field of FIG. 1, this arrangement permits a better distribution of electrons in their travel from cathode 22 through the cross-section of chamber 14. Consequently, the overall ion-beam profile is more uniform.

Turning next to FIG. 3, the general principle of overall operation is still the same. In this case, however, the anode is in the form of a plurality of sections 20*b* which are distributed around the walls of an ion chamber 12*b* except immediatley in front of the screen 24. For energization, all of anode sections 20*b* are tied together and connected to the appropriate one side of the discharge power source in the same manner as anode 20 is connected to the positive side of power source 36 in FIG. 1. Further in FIG. 3, anode sections 20*b* are interspersed with a series of magnetic pole pieces 48. Each pair of immediately-adjacent individual pole pieces are oppositely polarized so as to establish magnetic field lines, as indicated by arrows 50, which partially encircle the associated ones of anode sections 20*b* rather closely.

Overall, the operation of the system of FIG. 3 is essentially similar to that already described with respect to the divergent-field ion source of FIG. 1 or the radial-field ion source of FIG. 2. The significant difference in FIG. 3 is that the magnetic field strength is comparatively small over most of the volume defined by chamber 14. Consequently, the electrons emitted from cathode 22 are extremely well distributed over the interior of chamber 14, as a result of which the profile of the ion beam obtained is quite uniform. Consequently, the electrons emitted from cathode 22 are extremely well distributed over the interior of chamber 14, as a result of which the profile of the ion beam obtained is quite uniform.

With the foregoing background to serve as an aid in understanding the overall principles of operation and also as a basis for comparison, attention is now directed to the ion source of FIG. 4. A shell 12*c* defines ion chamber 14 at one end of which are screen 24 and grid 26. Beyond chamber 14 from grid 26 is the usual neutralizing cathode 30. As before, suitable arrangement for energizing the different components, including the anode, cathode 22, screen 24, grid 26 and cathode 30 is the same as that already described in detail with respect to the system of FIG. 1. Moreover, the typical parameter values exemplified with respect to the system of FIG. 1 are once again applicable.

In the case of FIG. 4, however, the anode is composed of a plurality of successively spaced segments 52 that, as shown, are distributed within chamber 14 along the wall thereof opposite screen 24. In an extension of this aproach, segments 52 may also be distributed along all of the walls of chamber 12*c* except immediately in front of screen 24. Each of segments 52 is fabricated of a magnetic material that also is electrically conductive. The different ones of segments 52 are interconnected so as collectively to constitute the overall anode. Moreover, individually adjacent ones of segments 52 respectively are oppositely polarized magnetically as a result of which segments 52 collectively serve to establish the magnetic field within chamber 14. In consequence, the produced magnetic field lines 54 are confined essentially to the successive regions immediately between the respective different ones of segments 52.

In operation, the arrangement of the system of FIG. 4 is such as to enable electrons emitted from cathode 22 to reach the ends of the different segments 52 without unwanted collision processes insofar as a significant proportion of such electrons have proper orientation with respect to magnetic field lines 54. That is, the end-edge portion of each of strips 52, facing screen 24, are exposed for the receipt of electrons that need not cross the magnetic field lines. Because those ends or edge portions are made small compared to the overall anode (and pole-piece) area, most of the electrons emitted from cathode 22 are reflected as they approach the anode assembly. In consequence ion chamber efficiency is maintained at an acceptable level. In turn, an extremely uniform ion beam profile is obtained without encountering any significant degree of complexity such as that which heretofore has been associated with so-called multipole design.

In perhaps a most direct approach, each of anode segments 52 is in itself a permanent magnet, or perhaps more completely a respective pole of a permanent magnet. Seemingly more practical, however, each of segments 52 is in itself composed of a strip of magnetizable material. In turn, and as shown in FIG. 5, each successive pair of such strips are spaced apart by respective individual magnets 56. In a specific configuration of the latter arrangement, each of segments 52 is a flat strip of mild steel twelve millimeters wide and 1.5 millimeters thick. The successive strips are spaced apart by a distance of twelve millimeters through the use of cylindrical permanent magnets 56 that are 6 millimeters in diameter and, of course, 12 millimeters long. A sufficient number of such magnets are utilized in order to obtain a field strength of 50 Gauss as measured on the center line of the strips.

In accordance with another feature of the ion source of FIG. 4, the propellant is introduced into chamber 14 from a direction which is at least generally opposite the direction in which the ions are accelerated out of the chamber. Thus, as shown, the propellant is introduced along a path 16*a* so as to enter chamber 14 through the apertures in grid 26 and screen 24. To this end, the pressure in the vacuum facility 58 which surrounds chamber 12*c* and the remaining active physical components of the ion source is maintained at a pressure of about $10^{-3}$ Torr. The level of that pressure is controlled by varying the feed rate of the propellant, in this case argon, into vacuum facility 58. It should be noted that such a comparatively high pressure limits the potential difference which may exist between screen 24 and grid 26 to a value of approximately 500 volts. Consequently, it becomes highly desirable in this instance to use a high-perveance accelerator system. That is, grid 26 is formed from a rather thin material and fabricated to have smaller and more closely-spaced holes than otherwise might need to be the case; this is in order to maintain the existence of a substantial ion-beam current even at the comparatively low accelerating potential difference. In a particular implementation, both grids 26 and 24 are formed of a material only 0.5 millimeters thick having two-millimeter-diameter holes so spaced as to result in a 65 percent open array at a grid spacing of 0.75 millimeters, such grids resulting in the production of ion-current densities of over 1 milliampere-per-centrimeter-squared even though the total accelerating potential difference is only 500 volts.

The overall result of introducing the propellant through the accelerator system end of chamber 14 was found to be a further uniformity in the density across the width of the ion beam. Of course, this feature, of introducing a propellant through the grid and screen assembly, is necessarily inapplicable to uses of the ion sources for space propulsion, because in that situation there is no surrounding vacuum facility. For sputter applications, however, the increased beam uniformity is decidely advantageous.

One salient feature of the described anode and polepiece arrangement is that it readily permits the ion chamber to be substantially elongated in at least one direction. Consequently, the present arrangement accommodates continuous processing by the moving of substrates or the like through the chamber on a conveyor or the equivalent. This contrasts sharply with prior ion chambers that are limited to the processing of one batch at a time.

While a particular embodiment of the invention has been shown and described, and various modifications thereof have been indicated it will be obvious to those skilled in the art that changes and other modifications may be made without departing from the invention in its broader aspects, and, therefore, the aim in the appended claims is to cover all such changes and modifications as fall within the true spirit and scope of the invention.

We claim:

1. In an electron-bombardment ion source which includes:

means defining a chamber for containing an ionizable propellant;

means for introducing said propellant within said chamber;

an anode disposed within said chamber;

an electron-emissive cathode disposed within said chamber;

means for impressing a potential between said anode and said cathode to effect electron emission at a sufficient velocity to ionize said propellant;

means for accelerating ions out of said chamber;

and means for establishing a magnetic field within said chamber to increase the efficiency of ionization of said propellant by said electrons;

the improvement comprising:

a plurality of successively-spaced segments of electrically conductive magnetic material distributed within said chamber;

means for interconnecting said segments with said impressing means so that said segments collectively constitute said anode, and individually adjacent ones of said segments respectively being oppositely polarized magnetically with said segments collectively establishing said magnetic field.

2. An ion source as defined in claim 1 in which said segments are each composed of a strip of magnetizable material and in which each successive pair of said strips are spaced apart by respective individual magnets.

3. An ion source as defined in claim 2 in which said magnets are permanent magnets.

4. An ion source as defined in claim 1 in which said segments are distributed along the side of said chamber opposite that out of which said ions are accelerated.

5. An ion source as defined in claim 1 in which each of said segments is a permanent magnet.

6. An ion source as defined in claim 1 in which said accelerating means includes an apertured grid disposed across one end of said chamber together with means for impressing a potential on said grid for accelerating said ions out of said chamber through said grid.

7. An ion source as defined in claim 6 which further includes an apertured screen spaced from said grid toward said chamber, the apertures in said screen being aligned with the apertures in said grid to shield the latter from ionic bombardment, and means for impressing on said screen a potential substantially equal to that on said anode and said cathode.

8. An ion source as defined in claim 6 which further includes neutralizing means disposed on the side of said grid beyond said chamber for neutralizing the electric space charge in ions withdrawn through and beyond said grid.

9. An ion source as defined in claim 6 in which said propellant is introduced into said chamber through said apertured grid.

10. An ion source as defined in claim 1 in which said propellant is introduced into said chamber from a direction at least generally opposite to the direction in which said ions are accelerated out of said chamber.

11. An ion source as defined in claim 10 in which said chamber is subjected to a source of vacuum, and in which said propellant is introduced into said source of vacuum.

12. An ion source as defined in claim 11 in which said propellant flows from said source of vacuum through an apertured grid that is included in said accelerating means.

13. An ion source as defined in claim 1 in which said segments are so shaped and oriented as to expose to said electrons only a portion of said segments which is free from the influence of said magnetic field, a portion which is small relative to the entire anode area defined by said segments.

* * * * *